(12) United States Patent
Flynn et al.

(10) Patent No.: US 7,778,020 B2
(45) Date of Patent: Aug. 17, 2010

(54) APPARATUS, SYSTEM, AND METHOD FOR A MODULAR BLADE

(75) Inventors: David Flynn, Sandy, UT (US); Alan Hayes, Salt Lake City, UT (US); Bert Lagerstedt, Pleasant Grove, UT (US); John Strasser, Syracuse, UT (US); Jonathan Thatcher, Lehi, UT (US); Vince Warner, Alpine, UT (US)

(73) Assignee: Fusion Multisystems, Inc., Salt Lake City, UT (US)

( * ) Notice: Subject to any disclaimer, the term of this patent is extended or adjusted under 35 U.S.C. 154(b) by 296 days.

(21) Appl. No.: 11/952,119

(22) Filed: Dec. 6, 2007

(65) Prior Publication Data

US 2008/0137284 A1    Jun. 12, 2008

Related U.S. Application Data

(60) Provisional application No. 60/873,111, filed on Dec. 6, 2006.

(51) Int. Cl.
*H05K 7/20* (2006.01)
(52) U.S. Cl. .................. 361/679.31; 361/724; 361/725; 361/792; 312/223.1; 312/223.2
(58) Field of Classification Search ............ 361/679.32, 361/803
See application file for complete search history.

(56) References Cited

U.S. PATENT DOCUMENTS

| | | | |
|---|---|---|---|
| 3,478,251 A | 11/1969 | Perotto et al. | |
| 4,858,070 A * | 8/1989 | Buron et al. | ................. 361/695 |
| 5,261,068 A | 11/1993 | Gaskins et al. | |
| 5,438,671 A | 8/1995 | Miles | |
| 5,701,434 A | 12/1997 | Nakagawa | |
| 5,845,329 A | 12/1998 | Onishi et al. | |
| 5,960,462 A | 9/1999 | Solomon et al. | |

(Continued)

FOREIGN PATENT DOCUMENTS

WO    02/05611 A1    1/2002

OTHER PUBLICATIONS

PCT/US2007/025054, International Search Report and Written Opinion, Oct. 29, 2008.

(Continued)

*Primary Examiner*—Jayprakash N Gandhi
*Assistant Examiner*—Anthony Q Edwards
(74) *Attorney, Agent, or Firm*—Kunzler Needham Massey & Thorpe

(57) ABSTRACT

An apparatus, system, and method are disclosed for a modular blade. The blade has a first carrier card and a second carrier card. At least one of these cards connects into the backplane of a blade server and provides connectivity for the modular blade to the backplane. The carrier cards also provide connectivity between their respective attached devices. In order to increase the density available in a modular blade, the computing components on the first and second cards interleave with one another such that a maximum number of components fit in a minimal space. The modular blade also provides an airflow channel for air circulation necessary to provide cooling. The first carrier card and second carrier card may also be identical, with one of the identical pair rotated one-hundred and eighty degrees with respect to the other.

25 Claims, 10 Drawing Sheets

U.S. PATENT DOCUMENTS

| | | | |
|---|---|---|---|
| 6,000,019 A | 12/1999 | Dykstal et al. | |
| 6,170,039 B1 | 1/2001 | Kishida | |
| 6,170,047 B1 | 1/2001 | Dye | |
| 6,173,381 B1 | 1/2001 | Dye | |
| 6,185,654 B1 | 2/2001 | Van Doren | |
| 6,330,688 B1 | 12/2001 | Brown | |
| 6,356,986 B1 | 3/2002 | Solomon et al. | |
| 6,370,631 B1 | 4/2002 | Dye | |
| 6,385,710 B1 | 5/2002 | Goldman et al. | |
| 6,407,930 B1 * | 6/2002 | Hsu | 361/784 |
| 6,412,080 B1 | 6/2002 | Fleming et al. | |
| 6,418,478 B1 | 7/2002 | Ignatius et al. | |
| 6,496,366 B1 | 12/2002 | Coglitore et al. | |
| 6,523,102 B1 | 2/2003 | Dye et al. | |
| 6,556,440 B2 * | 4/2003 | Jensen et al. | 361/679.46 |
| D475,705 S | 6/2003 | Coglitore et al. | |
| 6,587,915 B1 | 7/2003 | Kim | |
| 6,601,211 B1 | 7/2003 | Norman | |
| 6,625,685 B1 | 9/2003 | Cho et al. | |
| 6,671,757 B1 | 12/2003 | Multer et al. | |
| 6,724,640 B1 | 4/2004 | Cooper | |
| 6,754,774 B2 | 6/2004 | Gruner et al. | |
| 6,775,185 B2 | 8/2004 | Fujisawa et al. | |
| 6,779,088 B1 | 8/2004 | Benveniste et al. | |
| 6,785,785 B2 | 8/2004 | Piccirillo et al. | |
| 6,850,408 B1 | 2/2005 | Coglitore et al. | |
| 6,877,076 B1 | 4/2005 | Cho et al. | |
| 6,880,049 B2 | 4/2005 | Gruner et al. | |
| 6,883,079 B1 | 4/2005 | Priborsky | |
| 6,938,133 B2 | 8/2005 | Johnson et al. | |
| 7,010,652 B2 | 3/2006 | Piccirillo et al. | |
| 7,035,111 B1 | 4/2006 | Lin et al. | |
| 7,043,599 B1 | 5/2006 | Ware et al. | |
| 7,045,717 B2 * | 5/2006 | Kolvick et al. | 174/135 |
| 7,050,337 B2 | 5/2006 | Iwase et al. | |
| 7,089,391 B2 | 8/2006 | Geiger et al. | |
| 7,181,572 B2 | 2/2007 | Walmsley | |
| 7,194,577 B2 | 3/2007 | Johnson et al. | |
| 7,219,238 B2 | 5/2007 | Saito et al. | |
| 7,243,203 B2 | 7/2007 | Scheuerlein | |
| 7,280,373 B2 * | 10/2007 | Aizawa | 361/803 |
| 2002/0069317 A1 | 6/2002 | Chow et al. | |
| 2002/0069318 A1 | 6/2002 | Chow et al. | |
| 2002/0182899 A1 | 12/2002 | Debord et al. | |
| 2003/0033361 A1 | 2/2003 | Garnett et al. | |
| 2003/0198084 A1 | 10/2003 | Fujisawa et al. | |
| 2004/0070955 A1 | 4/2004 | Dobbs et al. | |
| 2004/0150964 A1 | 8/2004 | Uzuka et al. | |
| 2005/0002263 A1 | 1/2005 | Iwase et al. | |
| 2005/0015539 A1 | 1/2005 | Horii et al. | |
| 2005/0027951 A1 | 2/2005 | Piccirillo et al. | |
| 2005/0042893 A1 | 2/2005 | Debord et al. | |
| 2005/0168962 A1 * | 8/2005 | Takeuchi et al. | 361/796 |
| 2005/0193166 A1 | 9/2005 | Johnson et al. | |
| 2005/0246510 A1 | 11/2005 | Retnamma et al. | |
| 2006/0004955 A1 | 1/2006 | Ware et al. | |
| 2007/0016699 A1 | 1/2007 | Minami | |
| 2007/0198770 A1 | 8/2007 | Horii et al. | |
| 2008/0160899 A1 * | 7/2008 | Henry et al. | 454/184 |

OTHER PUBLICATIONS

PCT/US2007/025054, International Preliminary Report on Patentability, Jun. 18, 2009.
ASPMC_660, Asine Group, http://www.asinegroup.com/products/aspmc660.html, copyright 2002, downloaded on Nov. 18, 2009.
"BiTMICRO Introduces E-Disk PMC Flash Disk Module at Military & Aerospace Electronics East 2004", BiTMICRO, http://www.bitmicro.com/press_news_releases_20040518_prt.php.
NAND Flash 101: An Introduction to NAND Flash and How to Design It In to Your Next Product, Micron, pp. 1-28, Micron Technology Nov. 2006.
"High speed Elevated board stacking", Samtec Inc., Pub. Date 2007.
PCT/US2007/086704, International Preliminary Report on Patentability, Jun. 18, 2009.
PCT/US2007/086704, International Search Report and Written Opinion, Sep. 29, 2008.

* cited by examiner

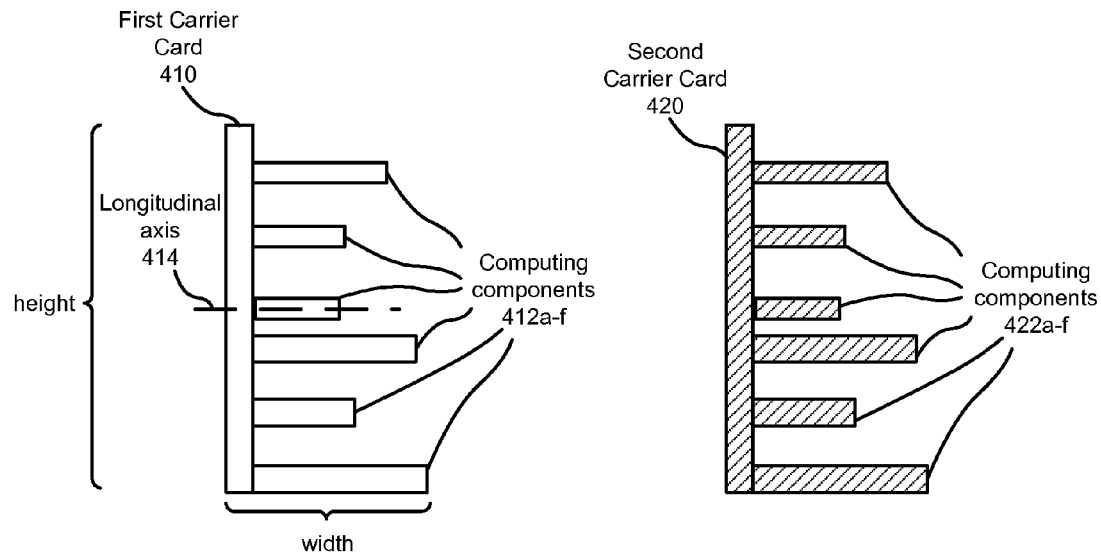
Fig. 4A
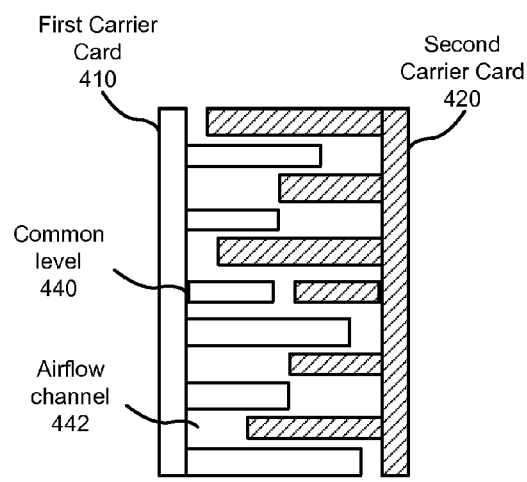
Fig. 4B
Fig. 4

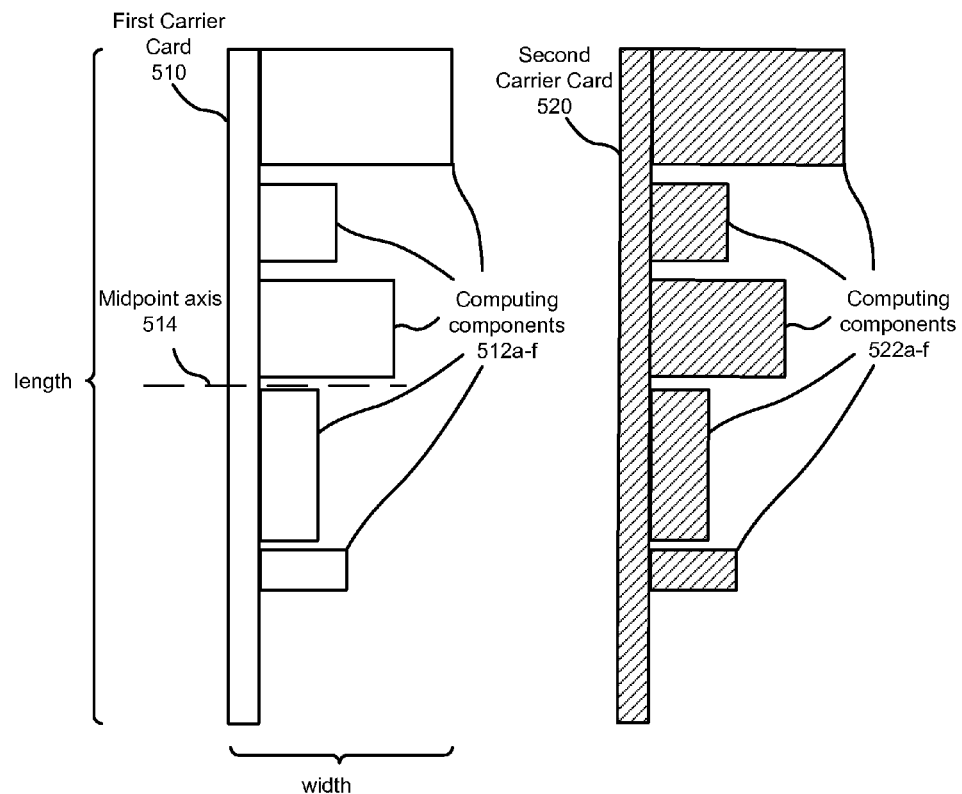
Fig. 5A
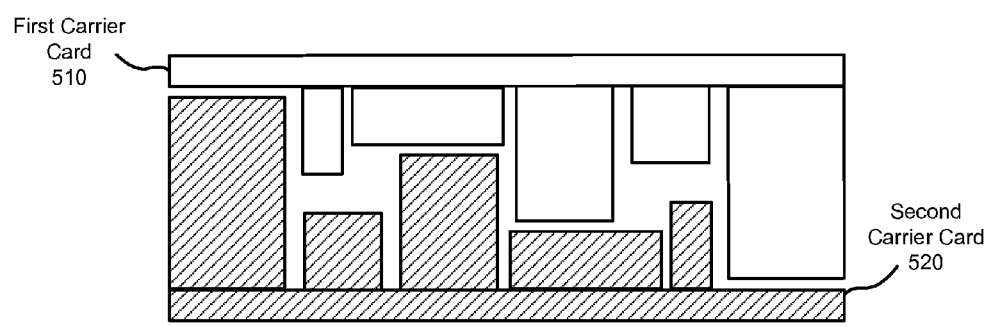
Fig. 5B
Fig. 5

APPARATUS, SYSTEM, AND METHOD FOR A MODULAR BLADE

CROSS-REFERENCES TO RELATED APPLICATIONS

This application claims priority to U.S. Provisional Patent Application No. 60/873,111 entitled "Elemental Blade System" and filed on Dec. 6, 2006 for David Flynn, et al. which is incorporated herein by reference.

BACKGROUND OF THE INVENTION

1. Field of the Invention

This invention relates to blade systems and more particularly relates to the configuration of units in a blade system.

2. Description of the Related Art

Blade computing is growing in popularity in the information technology ("IT") realm. As more and more services are offered via computers and computer networks, the hardware to support these services grows in size and complexity. Data centers quickly fill with more and more servers as demand for services grow. This continual demand for more computing power results in more hardware. And as more and more hardware is added, the management of the hardware, whether maintaining the networks, repairing damaged equipment, or other tasks, grows more and more complicated.

Blade servers offer an increasingly popular solution to the growing pains associated with other server systems. Blade servers are generally made up of thin blades that fit within a blade enclosure designed to provide support, power, and cooling to the blade server system. The core concept behind a blade server system is to remove from individual blades components that are unnecessary for the function that the particular blade is to perform. For example, a particular blade designed for processing may have a number of processors and sufficient memory to support the processing operations, but have all hard drive components removed, basic IO devices supporting peripherals such as keyboards removed, and power supply components removed. In contrast, a storage blade may have minimal processing capability but a great deal of storage. By removing items unrelated to the task the particular blade is to perform, a great deal of space can be saved.

The blade enclosure typically provides power and cooling to the individual blades in the enclosure. However, the particular functions left on the blade and those transferred to the enclosure vary from system to system. Regardless, blade systems generally work by sliding individual blades in and out of enclosures in the blade enclosure. The blade modules themselves slide into the enclosure and plug into a backplane, sometimes also referred to as a midplane, of the blade enclosure. The backplane often provides the power to the blade modules and may also provide some basic connectivity.

Blade servers thus provide more computing power in less space than independent servers. As a result of this density, the management of the system is greatly simplified. In addition, less space is physically required for comparable computing power from a traditional server system. However, in light of the continuing demand for more and more power, greater computing density is necessary. In addition, typical blade servers are not very scalable—a high initial cost is required to purchase a necessary enclosure, which may not be economically feasible for a small but growing entity.

As a result, many vendors are forced to offer a variety of blade servers for different types of customers. A vendor may offer, for example, an entry level model, a mid-level model, and an enterprise level model, with costs adjusted accordingly. The customer is then left with the dilemma of whether purchase an entry level system which they quickly outgrow, or whether to purchase a higher end system with more power than they may need for some time. Similarly, vendors are forced to produce a variety of products to meet the needs of different customers instead of producing a single scalable product that can be flexibly configured based on the particular needs of a buyer.

SUMMARY OF THE INVENTION

From the foregoing discussion, it should be apparent that a need exists for an apparatus, system, and method that allows for a scalable, high-density modular blade and blade server system. Beneficially, such an apparatus, system, and method would allow a user to easily tailor a particular blade module to their needs without sacrificing the ability to change its purpose in the future. In addition, the blade server system is ideally scalable and modular.

The present invention has been developed in response to the present state of the art, and in particular, in response to the problems and needs in the art that have not yet been fully solved by currently available modular blades. Accordingly, the present invention has been developed to provide an apparatus, system, and method for providing a module blade that overcomes many or all of the above-discussed shortcomings in the art.

The apparatus, in one embodiment, is a modular blade that is provided with a first carrier card and a second carrier card. The first carrier card has a backplane connector that connects to a backplane of a computer system. The first carrier card includes two or more computer components, and the first carrier card communicatively connects one or more of the computer components and the backplane connector. The first carrier card may also communicatively connecting two or more of the computer components. The second carrier card includes one or more computer components, and the second carrier card communicatively connects one or more of the computer components of the second carrier card. The first carrier card faces the second carrier card such that two or more computer components of the first carrier card interleave with the one or more computer components of the second carrier card. Interleaving includes alternating computer components of the first carrier card with computer components of the second carrier card along one or more axes of the modular blade.

In one embodiment, the second carrier card is identical to the first carrier card, and the second carrier card is rotated about one of a longitudinal axis and a midpoint axis one-hundred and eighty degrees with respect to the first carrier card. In another embodiment, interleaving may include alternating computer components of the first carrier card with computer components of the second carrier card along one or more axes of the modular blade such that the computer components stack along one or more axes without physically touching computer components on an opposite carrier card. In a further embodiment, the first carrier card may be asymmetrical about an axis of the first carrier card where the axis is one of a longitudinal axis, a midpoint axis, a diagonal axis, and a combination of said axes.

In one embodiment, the computer system may be one of a computer rack, a computer chassis, and a blade enclosure. In another embodiment, the first and second carrier cards provide one or more of mechanical connectivity and power connectivity between the one or more computer components. In addition, communications connectivity may be considered either electrical or optical communications. In yet another embodiment, the apparatus may include a connectivity module for enabling communications between computer components of the first carrier card and computer components of the second carrier card. In a further embodiment, the connectivity module communicatively connects one or more computing components of the second carrier card with the first carrier card, wherein the computing components of the second carrier card respond to commands from a baseboard management controller (BMC) located on the first carrier card.

In one embodiment, of the apparatus, the apparatus may include one or more baseboard management controllers (BMCs). In another embodiment, one or more computer components may be micro-blades that include memory, an input module, and an output module, and where each micro-blade connects to one of the first carrier card and second carrier card through a non-cable connection. In a further embodiment, the non-cable connection may be a PCI express connection, an Infiniband connection, an Ethernet connection, an intelligent platform management interface (IPMI) connection, an I²C connection, or a Fibre Channel connection. In another embodiment, the one or more micro-blades may include a general processor, a specialized processor, or a programmable logic array processor. In yet a further embodiment, the BMC may be a micro-blade that includes a processor, memory, an input module, and an output module.

In one embodiment, the apparatus may include a shroud encasing the first carrier card and second carrier card such that the shroud provides electromagnetic and electrostatic shielding. In another embodiment, the first carrier card may include one or more additional backplane connectors, and the second carrier card may also include one or more backplane connectors.

A system of the present invention is also presented. The system substantially includes the modules and embodiments described above with regard to the apparatus. In one embodiment, the system includes one or more modular blades and a backplane of a blade server. Each modular blade may include a first carrier card, a second carrier card, and a shrouding. The first carrier card has a backplane connector that connects to a backplane of a computer system, and the first carrier card typically includes two or more computer components. The first carrier card communicatively connects one or more of the computer components and the backplane connector. The first carrier card may further communicatively connect two or more of the computer components. The second carrier card includes one or more computer components, and the second carrier card communicatively connects one or more of the computer components of the second carrier card. The shrouding encases the first carrier card and the second carrier card. In one embodiment, the first carrier card faces the second carrier card such that two or more computer components of the first carrier card interleave with the one or more computer components of the second carrier card. Interleaving typically includes alternating computer components of the first carrier card with computer components of the second carrier card along one or more axes of the modular blade. The backplane of the blade server may include a blade connectivity module and a power distribution module. The blade connectivity module may be configured to enable communications between one or more computing devices attached to the backplane. The one or more computing devices include one or more modular blades and one or more computing devices connected over a network. The power distribution module may be configured to supply power to one or more modular blades attached to the backplane.

In a further embodiment, the blade connectivity module may include one or more blade aggregation modules that enable communications between one or more modular blades. In yet a further embodiment, the blade connectivity module may include one or more transition cards, where each transition card connects with the blade aggregation module. One or more transition cards may connect with the backplane connectors of the modular blades, and one or more transition cards may connect with the one or more computing devices connected over a network.

In one embodiment of the system, a first blade aggregation module is connected to a first connector of each transition card, and a second blade aggregation module is connected to a second connector of each transition card connected to the first blade aggregation module. In a further embodiment, the second blade aggregation module is identical to the first blade aggregation module. In another embodiment, each blade aggregation module may include one or more switches that provide communication between two or more computing devices communicating with the switch. In yet another embodiment, one or more blade aggregation modules connected with a set of modular blades by one or more transition cards constitutes a bladed unit, wherein the blade connectivity module includes one or more unit aggregation modules communicatively connecting two or more bladed sets. In a further embodiment, each of the one or more unit aggregation modules includes one or more switches.

A method of the present invention is also presented for implementing a scalable, modular backplane. The method in the disclosed embodiments substantially includes the steps necessary to carry out the functions presented above with respect to the operation of the described apparatus and system. In one embodiment, the method includes assembling one or more modular blades including a first carrier card, wherein the first carrier card includes one or more computer components, and a second carrier card including one or more computer components. The method may also include connecting one or more transition cards to a first blade aggregation module, wherein the first blade aggregation module aligns the plurality of transition cards to receive one or more modular blades. In one embodiment, the method may also include connecting the one or more transition cards to a second blade aggregation module, wherein the second blade aggregation module is identical to the first blade aggregation module. In a further embodiment, the method includes connecting each of the one or more modular blades to at least one of the plurality of transition cards.

In one embodiment of the method, assembling a modular blade includes inserting two or more micro-blades into one or more connectors of the first carrier card and one or more connectors of the second carrier card. The micro-blades of the second carrier card may interleave with the micro-blades of the first carrier card, wherein interleaving includes alternating computer components of the first carrier card with computer components of the second carrier card along one or more axes of the modular blade. In a further embodiment, the method may include encasing the first carrier card and the second carrier card in a shroud.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 4 is a schematic diagram made up of FIGS. 4A and 4B illustrating two representations of a first carrier card and a second carrier card interleaving;

FIG. 5 is a second schematic diagram made up of FIGS. 5A and 5B illustrating two representations of a first carrier card and a second carrier card interleaving;

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
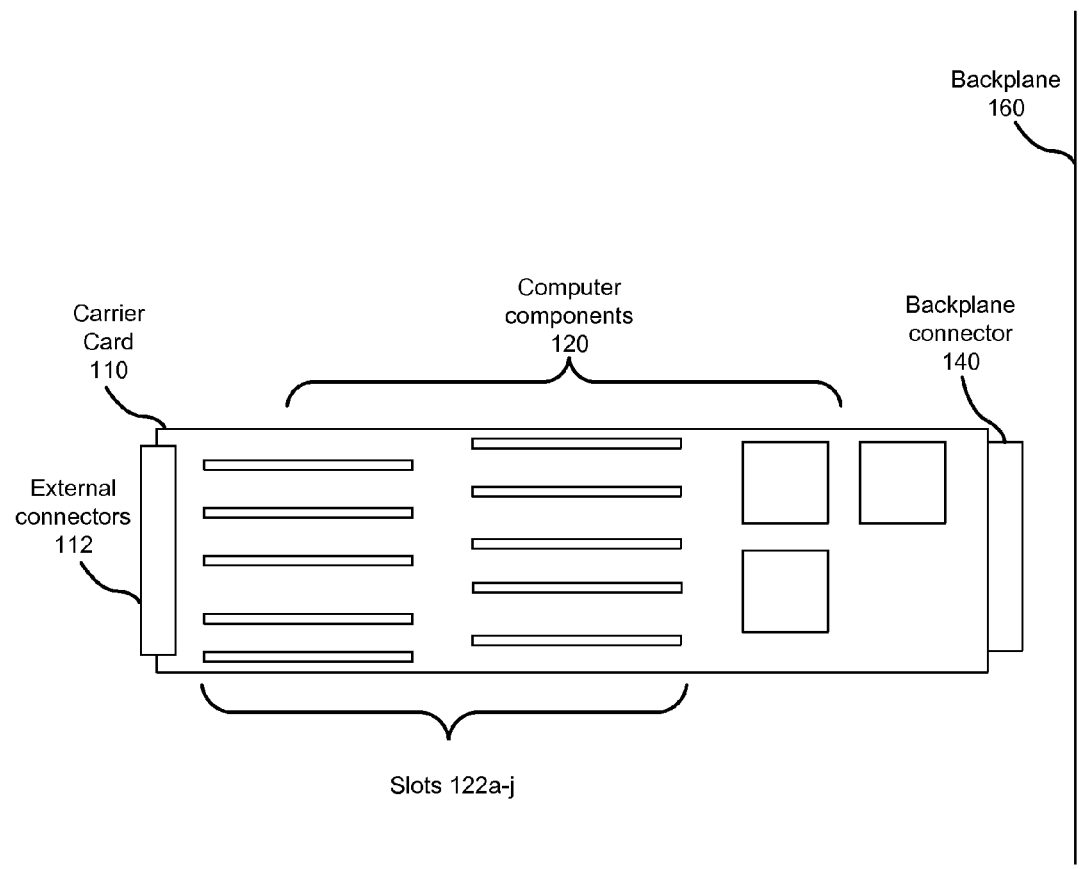
FIG. 1 is a schematic diagram illustrating one embodiment of a carrier card in accordance with the present invention.

FIG. 1 depicts one embodiment of a carrier card 110. The carrier card 110 is one of the components of a modular blade, described in its entirety below. The basic purpose of the carrier card 110 is to provide the electrical and logical connections by which associated devices may communicate. These tasks are performed by various computer components 120 of the carrier card 110. Computer components 120 may be physically built into the carrier card 110 or may be attached to the carrier card 110 through other computer components 120, such as slots.

The computer components 120 may include components that physically extend from the carrier card 110, such as fans, processors, and memory chips, but also include slots or connections for other devices. For example, the thin rectangles shown on the carrier card 110 may represent slots 122a-j that allow other computer components 120 to attach to the carrier card 110 through a PCI express connection.

The carrier card 110 may provide a variety of services and functions through the computer components 120. For example, the carrier card 110 may distribute power to the various computer components 120 attached to it through power connectors and circuits. As mentioned above, the carrier card 110 provides communications connectivity between two or more computer components 120 attached to it. This communications connectivity may be provided by an electrical connection or an optical connection. In addition, the carrier card 110 also provides power connectivity between the one or more computer components 120 as well as providing the necessary mechanical connectivity to hold the computer components 120 in place.

In one embodiment, the carrier card 110 may also comprise one or more external connectors 112 which communicatively attach the carrier card 110 to external devices. For example, the carrier card 110 may comprise 10 GB Ethernet connectors which connect one or more computer components 120 to devices communicating on a network via 10 GB Ethernet. Those of skill in the art will appreciate that the external connector 112 can be configured to allow communications using a variety of protocols and communications types. Such a configuration may be used in an embodiment where the blade server system is configured to operate as a network switch. It may also be used to provide an additional avenue for communications with the outside world.

The carrier card 110 also includes a backplane connector 140. The backplane connector 140 provides a communications connection between various computer components 120 of the carrier card 110 and the backplane 160. The backplane connector 140 may be a variety of different communications connections known to those in the art. For example, the backplane connector 140 may be a PCIe AS, Infiniband, or Ethernet connection. Ideally, the backplane connector 140 makes a non-cable connection with the backplane 160. The carrier card 110 may also provide additional backplane connectors 140. The additional backplane connectors 140 may provide redundancy to protect against failure in one of the backplane connectors 140, or may also be used to increase the bandwidth available from the carrier card 110 to the backplane 160.

The backplane 160 is the backplane of a computer system. This system may be characterized as part of a computer rack, a computer chassis, or a blade enclosure. In general, however, the computing system of which the backplane 160 is a part is designed to interconnect a variety of different computer servers or blades to allow them to work together in providing services to computers communicating with the system over a network such as the internet. Those of skill in the art will recognize, however, that a rack or blade enclosure system is not limited to a particular purpose. The backplane 160 is often physically incorporated into the chassis of the computer system. The role and nature of the backplane 160 is discussed in greater detail below.

Figure 2:
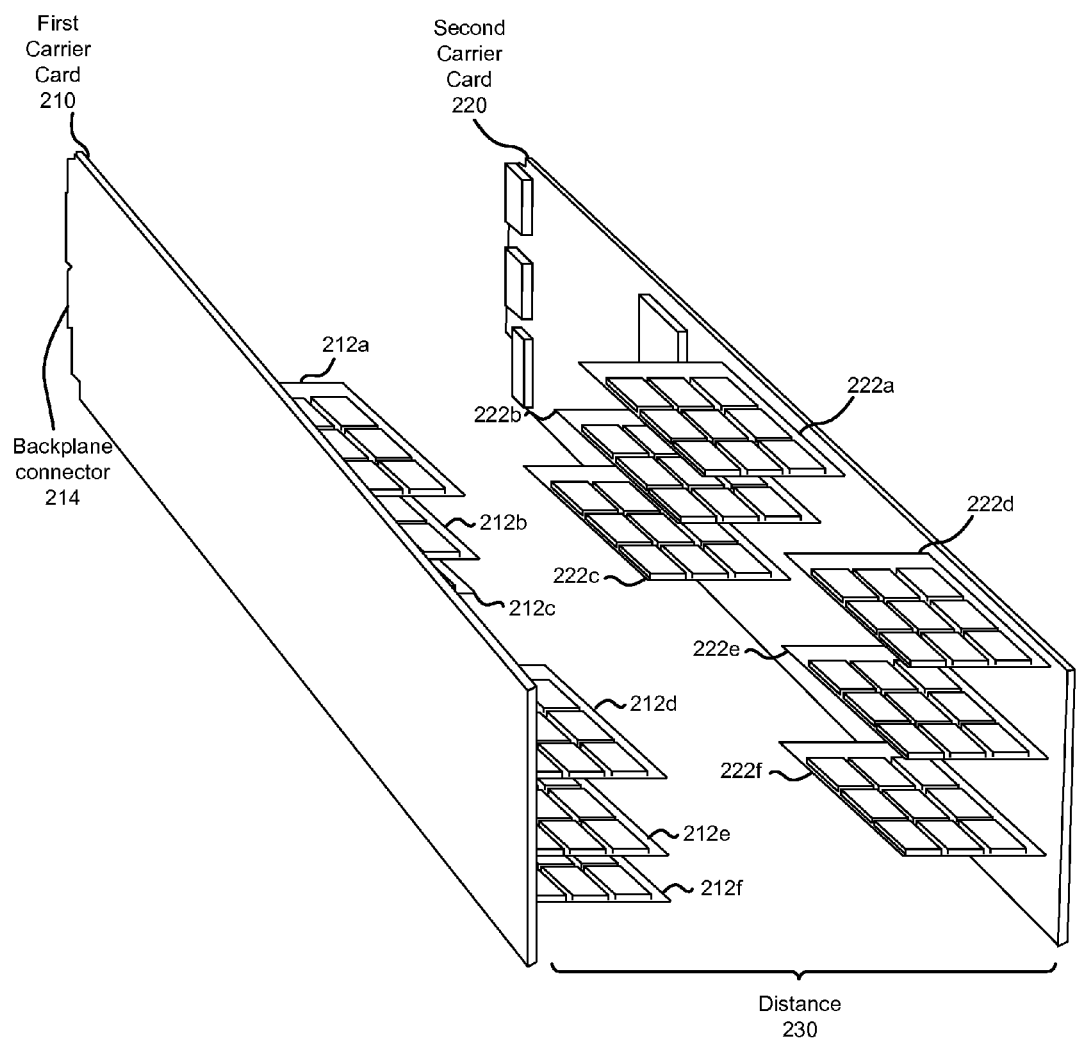
FIG. 2 is a schematic diagram illustrating one embodiment of a first carrier card and a second carrier card in accordance with the present invention

FIG. 2 shows a first carrier card 210 and a second carrier card 220. The two carrier cards 210 and 220 can be combined to form a modular blade. The depicted first carrier card 210 and second carrier card 220 are made up of various computer components, including the computer components 212a-f and 222a-f respectively. These computer components 212a-f and 222a-f may be micro-blades, described in greater detail below. The first carrier card 210 has a backplane connector 214 and also includes six computer elements 212a-f extending out of the plane of the first carrier card 210. The first carrier card 210 communicatively connects one or more of the computer elements 212a-f with the backplane connector 214. The computer elements 212a-f can use this connection to communicate with other devices which are also communicatively connected with the backplane 160. In addition to providing communications connectivity through the backplane connector 214, the first carrier card 210 also communicatively connects two or more of the computer elements 212a-f on the first carrier card 210.

The first carrier card 210 as described above provides at least two levels of communications connectivity; interconnectivity between attached computer components 212a-f, and outer connectivity between the computer components 212a-f and the outside world through the backplane connector 214. Those of skill in the art will appreciate, however, that fewer or more levels of connectivity may be provided by the first carrier card 210. In addition, these levels may be implemented in a variety of ways. For example, in one embodiment, the first carrier card 210 may provide each computer element 212a-f with an on-board connection to every other computer element 212a-f as well as an off-board connection to the backplane connector 214. In another embodiment, the first carrier card 210 may simply provide each element 212a-f with an off-board connection to the backplane connector 214, and allow the computing elements 212a-f to leverage this connection in order to communicate with one another. In such an embodiment, the backplane 160 provides the inter-connectivity between the discrete computing components 212a-f.

Orienting computer components 212a-f out of the plane of the first carrier card 210 results in a high density of computing power on the first carrier card 210. Traditionally, computing components are oriented such that they lay flat against the surface of an attached device, such as a motherboard. By orienting the computing components 212a-f out of the plane of the first carrier card 210, more computing components 212a-f can be fit onto a single carrier card.

Also shown in FIG. 2 is a second carrier card 220 including computer components 222a-f. The second carrier card 220, like the first carrier card 210, provides computer components 222a-f with communications connectivity such that the computer components 222a-f can communicate with other devices on the second carrier card 220. The second carrier card 220 may also be outfitted with a backplane connector 214, although only one carrier card of a pair requires a backplane connector 214.

In a modular blade configuration, the first carrier card 210 faces the second carrier card 220 such that the computer components 212a-f of the first carrier card 210 interleave with the computer components 222a-f of the second carrier card 220. As shown, the two carrier cards are separated by a distance 230. As depicted, the computer components 212a-f of the first carrier card 210 and the computer components 222a-f of the second carrier card 220 do not overlap at the depicted separation distance 230. When the first carrier card 210 and second carrier card 220 are pushed together to close the distance 230, to the point where their respective computing components occupy a shared area, the computer components 212a-f of the first carrier card 210 alternate with the computer components 222a-f of the second carrier card 220. The interleaving of the various components is discussed in greater detail in connection with FIGS. 4 and 5.

The orientation of computer components 212a-f and 222a-f out of the plane of the first carrier card 210 and second carrier card 220 respectively results in an extremely high-density blade module when the two carrier cards are fit together such that they interleave, as described above. The two interleaved carrier cards may be surrounded in a shroud, discussed and shown below, which provides electromagnetic and electrostatic shielding, as well as providing a form factor and structure for the carrier cards which allows them to connect to a computer system including a backplane.

In one embodiment, the first carrier card 210 and second carrier card 220 are identical. In order to fit the two identical carrier cards 210 and 220 together, the two cards are fit together as an opposing pair, described in more detail in connection with FIGS. 4 and 5. While the two carrier cards 210 and 220 are identical, they need not be identically configured. Rather, the first carrier card 210 and second carrier card 220 have identical integrated computer components. For example, the second carrier card 220 may have an identical number of slots as the first carrier card 210 located in identical positions. However, a user may configure the second carrier card 220 differently from the first carrier card 210. For example, a first carrier card 210 may have four micro-blades, such as computer components 212a-d, attached to the slots of the first carrier card 210. The second carrier card 220, in contrast, may have six micro-blades attached. Even with these different configurations, the two carrier cards 210 and 220 themselves are identical. Thus, the first carrier card 210 may have micro-blades generally suited to general server operations, while the second carrier card 220 may have storage micro-blades.

In one embodiment, the first carrier card 210 is connected to the second carrier card 220 by a connectivity module. The connectivity module enables direct communications between the computer components 212a-f of the first carrier card 210 and the computer components 222a-f of the second carrier card 220. The connectivity module may, for example, be a bridge connecting the network segments represented by the first carrier card 210 and the second carrier card 220 at the physical layer.

A first carrier card 210 and a second carrier card 220 may additionally include a baseboard management controller (BMC). The BMC performs many of the management functions for the first carrier card 210, and a collection of BMCs throughout a blade server may provide management functions for the entire blade server system. For example, the BMC on the first carrier card 210 may include a heat sensor which it uses to adjust fan speed. The BMC may provide a variety of other services, such as identifying the location of the first carrier card 210 in a blade server system. In one embodiment, the BMC is a micro-blade having a processor, memory, an input module, and an output module.

Using a first carrier card 210 paired with an identical second carrier card 220 offers a number of advantages over the prior art. First, for manufacturers, the fabrication process is greatly simplified. In addition, for users, obtaining replacements is greatly simplified as the number of specialty parts is reduced. However, in some instances, a user may wish to forgo the additional expense of a second carrier card 220 when only a single carrier card 210 is needed. A "placebo card" carrier card may be used in place of the second carrier card 220.

In one embodiment, the placebo card has the same general structure as the second carrier card 220 which provides the necessary support for the shroud that will cover the first carrier card 210 and placebo card pairing without including any computer components. In other embodiments, the placebo card may comprise a fan which is controllable by the (BMC) on the first carrier card 210. In such an embodiment, the completed blade module is less expensive, but still has the benefit of a multi-fan cooling system.

Those of skill in the art will appreciate, however, that the above is simply one example of the use of a BMC on the first carrier card 210 to manage or control computing components 222a-f on the second carrier card 220. Since the connectivity module communicatively connects the first carrier card 210 with the second carrier card 220, the computing components 222a-f may respond to commands from the BMC on the first carrier card 210. Such an embodiment provides the benefit of having a redundant management piece capable of providing management support for both the first carrier card 210 and the second carrier card 220.

Figure 3:
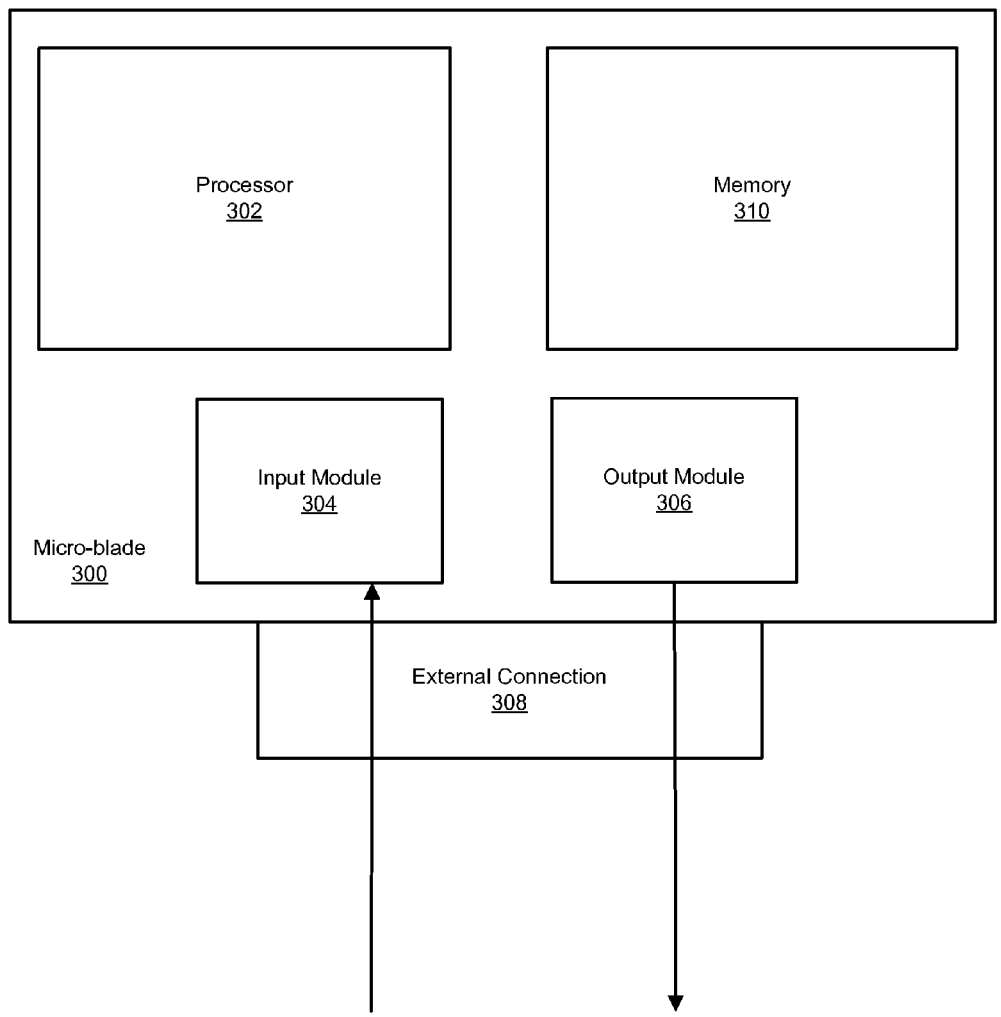
FIG. 3 is a schematic block diagram of a micro-blade in accordance with the present invention

FIG. 3 is a schematic block diagram of one embodiment of a micro-blade 300. In many blade systems, many computing components are integrated into a motherboard. Such a configuration limits flexibility in the construction of a computing system particularly suited to the particular, and changing, needs of an organization. In addition, the failure of an integrated component requires replacement of the entire motherboard, often at considerable expense.

By replacing the traditional motherboard with a carrier card, such as the first carrier card 210, and providing that many of the computing components 212a-f are removable, the first carrier card 210 provides a much more flexible solution. Micro-blades, such as the micro-blade 300, used in conjunction with a minimum of integrated components, offer a highly flexible and adaptable blade module solution.

The micro-blade 300 comprises a processor 302, memory 310, an input module 304, an output module 306, and an external connection 308. The micro-blade 300 can be connected to a slot on a carrier card 110 and thus incorporated into a modular blade.

In one embodiment, the micro-blade module 300 is an autonomous unit operational and capable of providing services when it is connected to a carrier card 110. Micro-blades 300 may be used to provide a variety of services as part of a blade server system.

The micro-blade 300 includes a processor 302. The processor 302 is a logic unit that provides performs the operations necessary for the particular micro-blade 300. In one embodiment, the processor 302 may be a general purpose processor capable of providing a wide range of services. In other embodiments, the processor 302 may be a specialized processor. For example, as known to those of skill in the art, specialized processors can be optimized for particular tasks such as graphics processing, physics processing, digital signal processing, and other functions. In particular, specialized processors may include network packet processors, cryptography acceleration processors, parsing acceleration processors, and vector co-processors.

The processor 302 may also be a programmable logic array processor such as a field programmable gate array (FPGA) unit. Such an embodiment may offer additional flexibility in changing, altering, or updating the function of a particular processor 302. In addition, the micro-blade 300 may not need a processor 302 in certain embodiments such as a storage micro-blade.

The micro-blade 300 also includes an input module 304 which allows the micro-blade 300 to receive data and instructions from other devices. Conversely, the micro-blade 300 also includes an output module 306 which allows the micro-blade 300 to communicate data and instructions to other devices. The exact nature of the input module 304 and the associated input, like the exact nature of the output module 306 and the associated output, may vary widely based on the particular function of the micro-blade 300.

In addition, the micro-blade 300 includes memory 310. The memory 310 may vary in size and function based on the purpose of the particular micro-blade 300. In one embodiment, the memory 310 may be 640 GB of solid state storage, in which case the micro-blade 300 may serve as a storage micro-blade. Where the micro-blade 300 is largely designed to perform processing operations, the memory 310 may simply be the registers associated with the processor 302 necessary to perform the desired operations.

The micro-blade 300 further comprises an external connection 308. In one embodiment, the external connection 308 is a non-cable connection configured to connect with a slot on a carrier card 110. This non-cable connection may be, for example, a PCI express connection, Infiniband connection, Ethernet connection, intelligent platform management interface (IPMI) connection, an I²C connection, Fibre Channel connection, or other connection known to those of skill in the art. Such a connection provides high-speed communications between the micro-blade 300 and associated devices such as other micro-blades 300 on the same carrier card 110 or other blade modules in the blade server system.

Micro-blades 300, in various configurations, can provide a wide array of services. As mentioned above, a micro-blade 300 may provide general or specialized processing services. A micro-blade 300 may be used to provide storage. The micro-blade 300 may be configured to provide DRAM storage, sold state storage (such as Flash, MRAM, NRAM, and others), or disk storage. In addition, a micro-blade 300 may provide IO Connectivity services by operating as a bridge, switch, router, traffic shaper, or performing other functions known to those of skill in the art.

As mentioned above, the micro-blades 300 may be added to, replaced, or removed from a particular carrier card 110. Using micro-blades 300, a user may easily customize a carrier card 110, and a corresponding modular blade, to perform particular tasks. In addition, as the needs of the user change, the modular blade can be reconfigured by opening the casing and adding or removing micro-blades 300 to the modular blade. They result is a blade server system with fewer and more versatile component types which also allow for more dense computing systems. In addition, the user can take advantage of the dynamic range of the system, starting from a single modular blade comprising one carrier card 110 and a few micro-blades 300, to extremely complex, sophisticated systems made up of many modular blades with many micro-blades 300.

FIGS. 4A and 4B are schematic diagrams of a first carrier card 410 comprising computing components 412a-f and a second carrier card 420 with associated computing components 422a-f. As shown in FIG. 4A, in one embodiment, the first carrier card 410 and the second carrier card 420 are identical. As discussed above, while the first carrier card 410 and the second carrier card 420 are also identically configured with computing components 412a-f and 422a-f respectively, such an embodiment is not necessary for the present invention. FIG. 4A presents a perspective of the first carrier card 410 and the second carrier card 420 from the front of each configured card, with the height and width of the card labeled appropriately. The length of the two cards is not visible from the presented perspective.

FIG. 4B shows one embodiment of the first carrier card 410 and second carrier card 420 with interleaving elements. As shown, the second carrier card 420 is rotated one-hundred and eighty degrees about its longitudinal axis, which runs down its length, with respect to the first carrier card 410. As a result, the computing elements of the first carrier card 410 and the second carrier card 420 interleave, thus taking less space to form a complete modular blade encompassing both carrier cards.

As shown in FIG. 4B, the computer components of the first carrier card 410 alternate with those of the second carrier card 420 along the height of the two carrier cards. While not shown, this pattern repeats for the various computer components along the length (or longitudinal axis) of the two carrier cards 410 and 420. As a result, the computer components form a stack in the area separating the first carrier card 410 and the second carrier card 420 without physically touching.

FIG. 4 also demonstrates that the first carrier card 410 is asymmetrical about an axis. As shown in FIG. 4A, the first carrier card 410, and thus the identical second carrier card 420, are asymmetrical about a longitudinal axis 414. Those of skill in the art will appreciate that if the first carrier card 410 were symmetrical about its longitudinal axis 414, it would not interleave with the identical second carrier card 420 after it had been rotated. The asymmetry allows the computer components 412a-f of the first carrier card 410 to interleave with the computer components 422a-f of the second carrier card 420 along the longitudinal axis of the modular blade.

Where a computer component 412a-f of the first carrier card 410 is at the same level as a computer component 422a-f of the second carrier card 420, the combined width of the two computer components is less than the distance separating the first and second carrier cards, 410, 420. An example is shown in FIG. 4B at the common level 440 marker, where the two computer components share a common level 440.

Also shown in FIG. 4B is the airflow channel 442. The airflow channel 442 runs along the length of the interior of the modular blade and allows airflow through the modular blade so that the various computing components can be kept at a proper operating temperature. In one embodiment, the first carrier card 410 and the second carrier card 420 each have a fan which blows air through the length of the airflow channel 442 and out the back of the modular blade. As discussed in connection with FIG. 4, these fans are interleaved to allow for a compact fit of the first carrier card 410 and the second carrier card 420. In one embodiment, the airflow channel 442 is made up of the open space between the interleaved computer components 412a-f and 422a-f.

Those of skill in the art will appreciate that the present invention is not limited to any particular type of asymmetry about any particular axis of the first carrier card 410. For example, FIG. 5 shows an alternative configuration of a first carrier card 510 and a second carrier card 520. FIG. 5A shows a first carrier card 510 with computing components 512a-f and an identical second carrier card 520 with associated computing components 522a-f. In contrast with FIG. 4, FIG. 5 presents a perspective of a first carrier card 510 and a second carrier card 520 such that the lengths and the widths are shown. As shown, the first carrier card 510 and second carrier card 520 are asymmetric about a midpoint axis 514. As such, when the second carrier card 520 is rotated about the midpoint axis 514, the computer components 522a-f interleave with the computer components 512a-f as shown in FIG. 5B.

FIG. 5B shows the computer components 522a-f stacking with the computer components 512a-f along the length of the first carrier card 510. As before, this interleaving allows a high density of computer components 512a-f and 522a-f to fit within a single modular blade. In one embodiment, the configuration in FIG. 5B also provides an airflow channel along the length of the modular blade.

Those of skill in the art will appreciate that the embodiments shown in FIGS. 4 and 5 are illustrative of many possible configurations. For example, the first carrier card 510 may be asymmetrical about a diagonal axis. Alternatively, the first carrier card 510 may be asymmetrical about a combination of said axes. Regardless, the asymmetrical configuration of the first carrier card 510 allows it to interleave with a second identical carrier card 520. Where the two carrier cards are identical, the vendor can produce a single carrier card 110 template and use that template to create high-density systems at less cost. A substitute placebo card described above can also be produced to allow a customer to grow into the blade server system at less cost.

Figure 6:
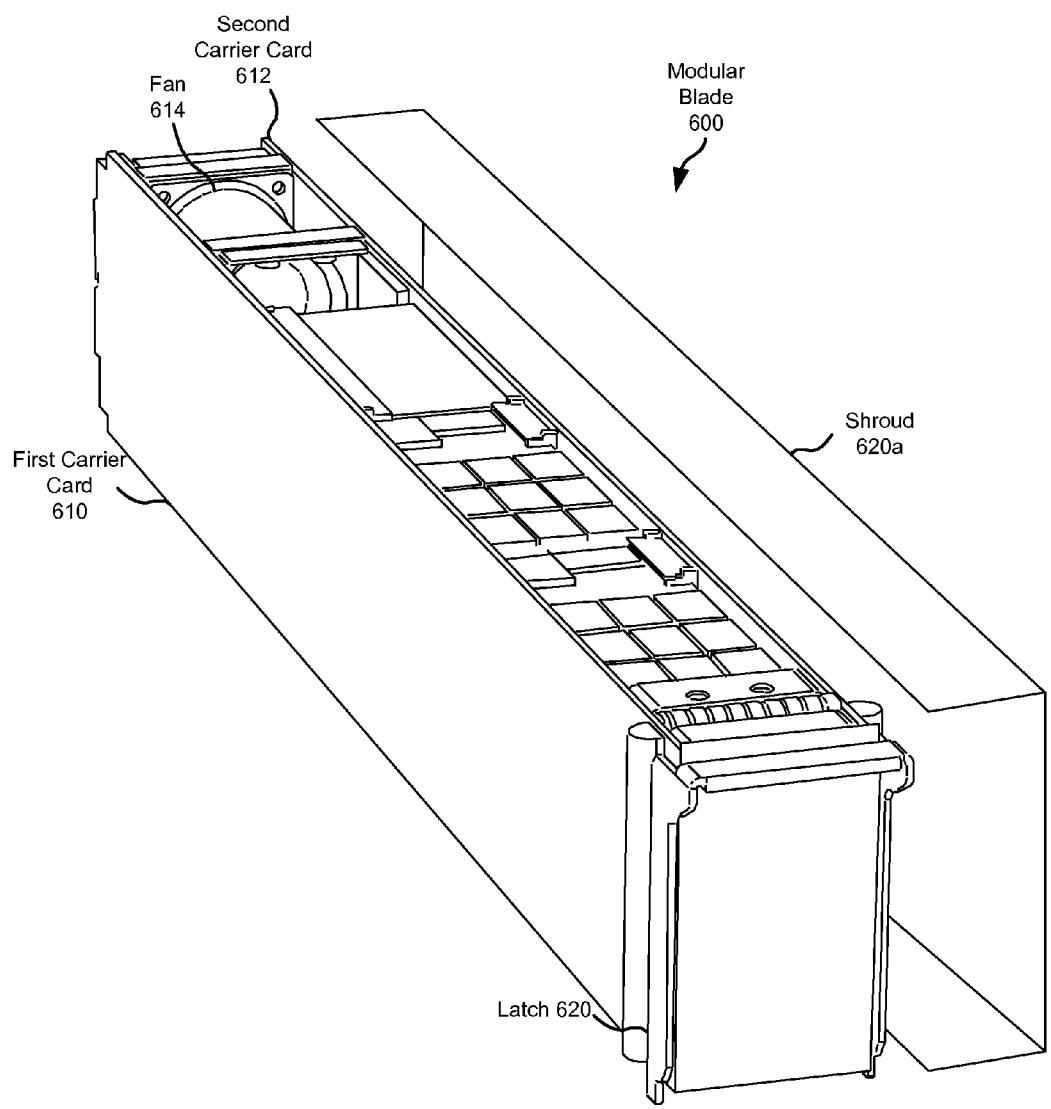
FIG. 6 is an illustration of a modular blade in accordance with the present invention.

FIG. 6 shows one embodiment of a partially-assembled modular blade 600. As discussed above, FIG. 6 shows the first carrier card 610 and its corresponding computer components interleaved with the second carrier card 612 and its corresponding computer components. FIG. 6 also explicitly shows a fan 614 at a far end of the modular blade 600 which moves air through the interior airflow channel. In one embodiment, the modular blade 600 also comprises a second fan located below the fan 614. The two fans may cooperate to circulate air throughout the interior of the modular blade 600.

FIG. 6 also shows a portion of a shroud 620a. The shroud 620a, and a corresponding shroud portion 620b (not shown) encase the first carrier card 610 and the second carrier card 612, providing electromagnetic and electrostatic shielding to the computing components of the modular blade 600. As shown, the shroud portion 620a fits over half of the modular blade 600 while a corresponding shroud portion 620b fits over the modular blade 600 from the opposite side, thus completely shielding the device. Those of skill in the art will appreciate that a variety of forms can be adopted for a shroud 620a,b such that the shroud 620a,b provides the needed physical support, protection of components, and shielding needed for the interior of the modular blade 600. The present invention is not limited to any particular shroud configuration.

FIG. 6 also shows a latch 620 on the front of the modular blade 600. As discussed above, the modular blade 600 may have numerous backplane connectors on both the first carrier card 610 and the second carrier card 612. As a result, proper insertion of the modular blade 600 into the backplane is important to prevent damage to the connectors or the backplane itself. A latch 620 may help facilitate proper insertion of the modular blade 600 by mechanically making a controlled connection when the user closes the latch 620 and similarly making a controlled disconnect from the backplane when the latch 620 is opened.

In one embodiment, the shroud 620 and latch 620 cooperate to allow a user ready access to the interior of the modular blade 600. The user can then easily swap and add computer components to first carrier card 610 and second carrier card 612 and tailor the functions of the modular blade 600 to a particular need.

Those of skill in the art will appreciate that the modular blade 600 may be implemented such that the modular blade 600 does not have a "right-side up"; that is, since the first carrier card 610 and second carrier card 612 are identical pairs, the modular blade 600 still functions properly in regardless of whether or not it is right-side up. In certain embodiments, the latch 620 may impose a particular orientation on the modular blade 600.

Figure 7:
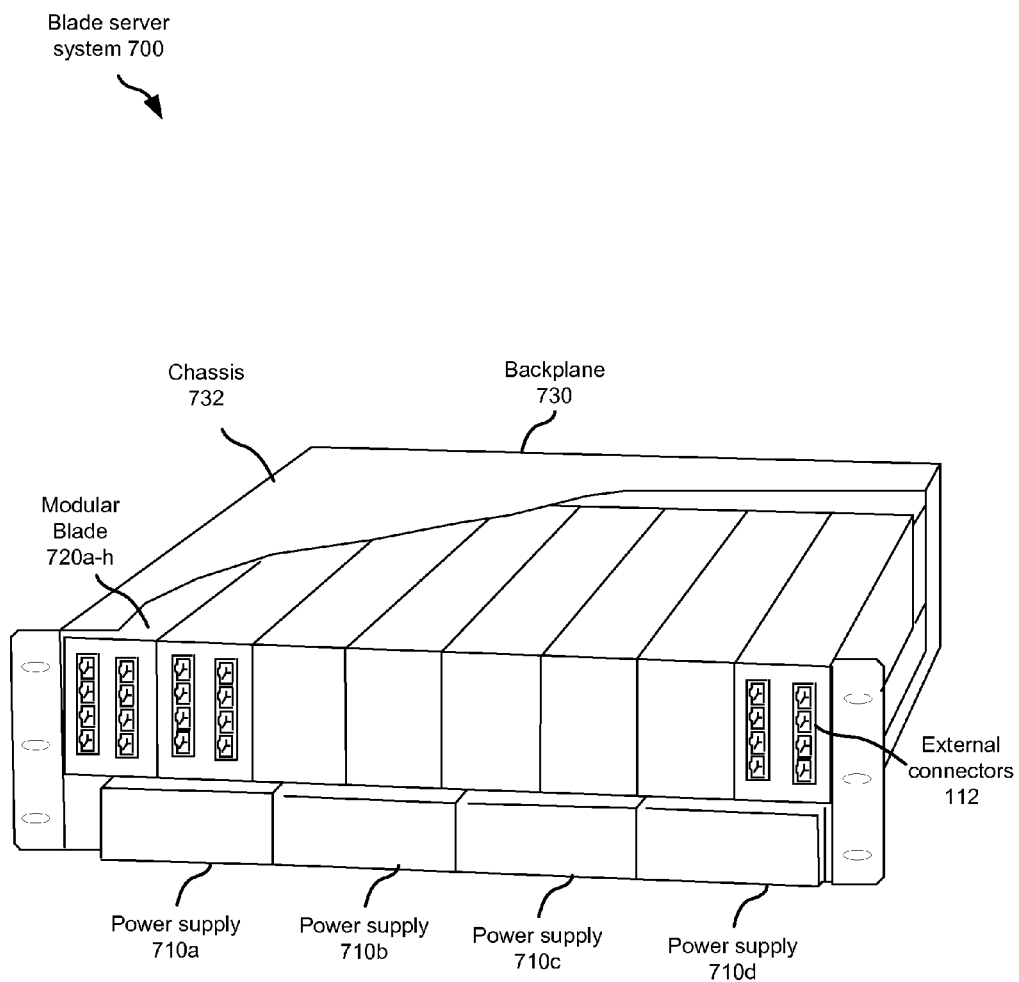
FIG. 7 is an illustration of a blade server system in accordance with the present invention.

FIG. 7 shows one embodiment of a blade server system 700. The blade server system 700 comprises modular blades 720a-h, a backplane 730, power supplies 710a-d housed in a chassis 732. The operations of the modular blades 720a-h have been discussed above, and as previously noted, can be connected in a blade server system 700 as shown. The individual modular blades 720a-h may have different functions based on the need for the particular user. For example, three modular blades 720a-h in FIG. 7 comprise 10 GB Ethernet external connectors 112 as discussed in connection with FIG. 1. In the depicted embodiment, the blade server system 700 is a 3U system. Those of skill in the art will appreciate that the blade server system 700 may be more or less complicated than that shown. Common embodiments, discussed below, may also include more modular blades 720a-h, such as in a 20U system.

The blade server system 700 further comprises a chassis 732 which provides the necessary support for the various components of the blade server system 700. In one embodiment, the chassis 732 provides a number of different housings for power supplies 710a-d as well as the modular blades 720a-h. The chassis 732 may further provide electrically connectivity between the blade server system 700 and a power source such as an outlet. Additionally, the chassis 732 may provide additional electromagnetic and electrostatic shielding for the system.

The power supplies 710a-d provide regulated power for the various components of the blade server system 700. A wide array of power supplies 710a-d are known to those of skill in the art. In addition, the blade server system 700 may include redundant power supplies 710a-d such that the failure of one particular power supply 710a-d does not bring the entire blade server system 700 offline.

The blade server system 700 also includes a backplane 730. As discussed above, a variety of backplanes 730 are known to those in the art. In typically embodiments, the backplane 730 provides connectivity between the different modular blades 720a-h and may also supply power to the various components, including the modular blades 720a-h. As such, the backplane 730 may include a power distribution module which supplies the needed power to the attached modular blades 720a-h. The modular blades 720a-h may be configured to connect to a variety of different types of backplanes 730.

In order to fulfill its functions, the backplane 730 typically comprises a blade connectivity module which enables communications between one or more computing devices attached to the backplane 730. For example, the backplane 730 enables communications between the modular blades 720a-h. In addition, the backplane 730 may enable communication between devices connected to it through a network. For example, computers may connect to the backplane 730 through one or more external connectors 112 of a modular blade 720a-h. The backplane 730 may have additional connectors located along the back of the blade server system 700.

Figure 8:
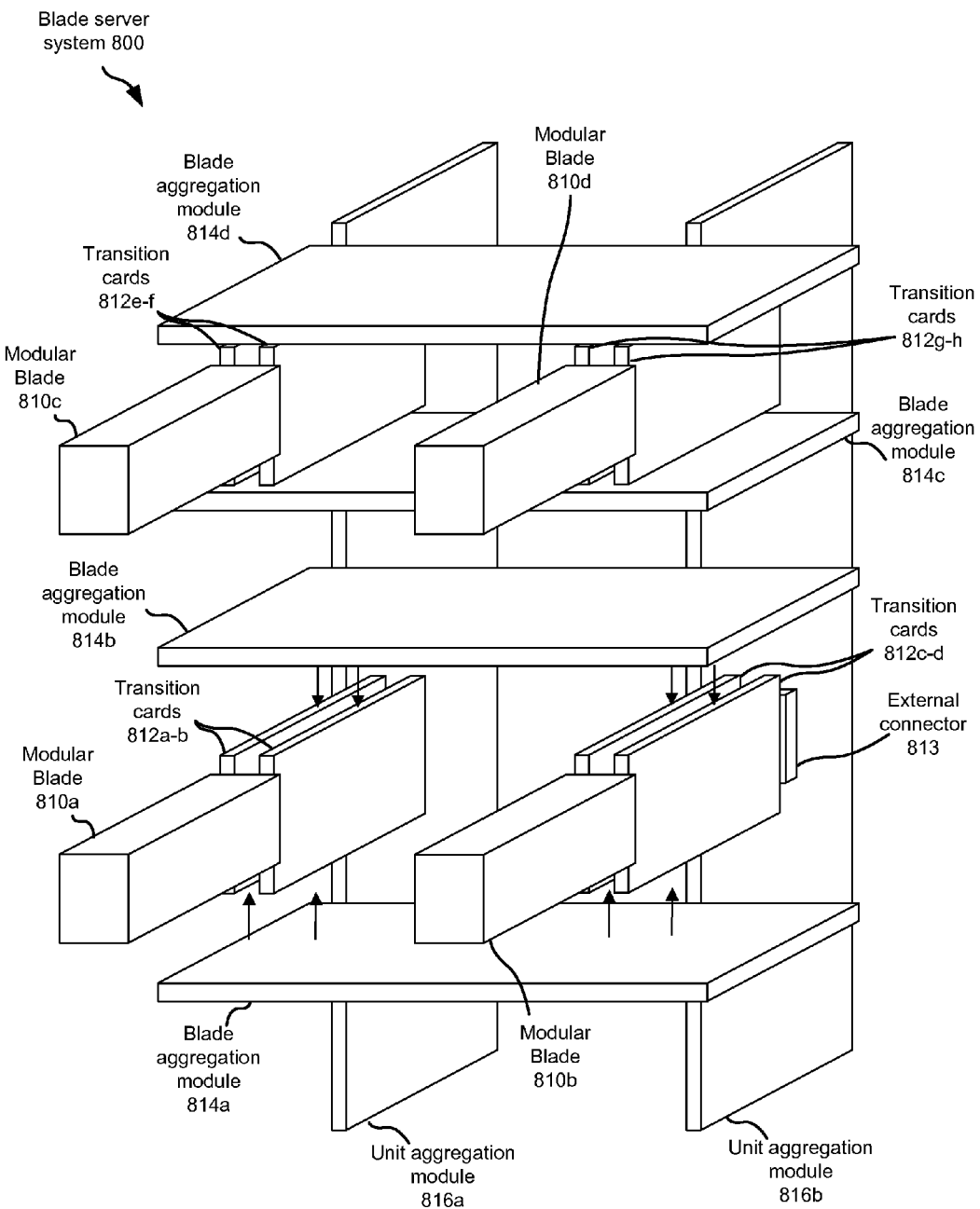
FIG. 8 is an alternate illustration of a blade server system in accordance with the present invention.

FIG. 8 is a schematic block illustration of a blade server system 800 with a modular backplane. The modular backplane includes blade aggregation modules 814a-d, transition cards 812a-h, and unit aggregation modules 816a-b. As discussed above in connection with FIG. 7, modular blades 810a-d plug into a backplane which provides interconnectivity between the attached modular blades 810a-d and between external devices connected via external connectors, whether they be part of the modular blades 810a-d or part of the backplane.

The backplane of blade server system 800 provides a scalable, modular, composite backplane which can grow and adapt in accordance with the needs of the customer. In addition, as described below, in one embodiment the backplane, like the modular blades 810a-d, is composed of identical modular parts making replacement, maintenance, and manufacture much simpler.

The backplane connectors of the modular blades 810a-d connect to one or more transition cards 812a-h. This connection provides the communication connection out of, and into, the related modular blades 810a-d, and may also provide the power connection necessary to power the components of the modular blades 810a-d. The transition cards 812a-h, in one embodiment, also include two additional connectors (such as top and bottom connectors in FIG. 8) which connect to one or more blade aggregation modules 814a-d. Some or all of the transition cards 812a-h may also include a fourth connector which connects to a unit aggregation module 816a-b or to computing devices connected over a network. For example, a transition card 812a-h may comprise a Fibre Channel connector over which it communicates with one or more networked computing devices.

In one embodiment, the transition cards 812a-b are an identical pair. The transition cards 812a-b may also be reversible in that they may be flipped front-to-back, or top-to-bottom, without changing the connectivity. In other embodiments, transition cards 812a-b may provide different types of connectivity dependent on their orientation.

The blade aggregation modules 814a-d enable communications between the modular blades 810a-d connected to it through the transition cards 812a-h. In addition, the blade aggregation module 814a-d also enables communications to and from the computing devices attached to the transition cards 812a-h over the network. In one embodiment, the blade aggregation module 814a-d may have various router or hub components to enable this functionality. In another embodiment, the blade aggregation modules 814a-d include switches that enable the communication between two or more computing devices which are communicating with the switch. For example, the blade aggregation modules 814a-d may provide connections between one or more attached devices, such as the modular blades 810a-d and the computing devices attached over the network, and one or more of the switches. Means for connecting the devices to the relevant switching components on the blade aggregation modules 814a-d are known to those with skill in the art.

As shown in FIG. 8, a blade aggregation module 814b is attached to the transition cards 812a-b and 812c-d through a bottom-to-top connection. A variety of different connectors, however, could be used in connection with a backplane system such as that being described. The modular blades 810a and 810b are connected to the blade aggregation module 814b through the transition cards 812*a-b* and 812*c-d*. The blade aggregation module 814*b* thus provides the necessary connection for the computing components of modular blade 810*a* to communicate with those of modular blade 810*b*. This grouping of modular blades 810*a-b* through the blade aggregation module 814*b* constitutes a bladed unit. As shown in FIG. 7, however, a bladed unit can be made up of any number of modular blades 810*a-d*. In one embodiment, one row of modular blades 810*a-d* in a bladed server 800 constitutes a bladed set connected by a blade aggregation module 814*b*.

FIG. 8 also shows a second bladed aggregation module 814*a* below the modular blades 810*a-b*. This bladed aggregation module 814*a* may connect to the bottom of the transition cards 812*a-d* to form a second communications connection with between the modular blades 810*a-b* and other computing devices. Those of skill in the art will recognize a number of reasons why a second bladed aggregation module 814*a* may be added in addition to the connection provided by blade aggregation module 814*b*. The second blade aggregation module 814*a* can provide a redundant connection in case of a failure in the first blade aggregation module 814*b*. The blade aggregation module 814*a* may also provide additional bandwidth to facilitate faster communications.

In one embodiment, the first blade aggregation module 814*b* connected to the top of the transition cards 812*a-d* is identical to the second blade aggregation module 814*a* connected to the bottom of the transition cards 812*a-d*. As with the carrier cards of the modular blades 810*a-d*, such an embodiment provides a number of advantages over other backplane solutions. For example, a single blade aggregation module 814*b* may be produced at less expense than a full backplane. In addition, a customer can more affordably build a blade server system 800 by adding the necessary connectivity as the need develops. For example, a small system may be sufficient with only a single blade aggregation module 814*b*. As traffic and a need for bandwidth grows, or in order to provide redundancy, a customer may add components such as the second blade aggregation module 814*a* in accordance with need and the availability of funds.

In another embodiment, the second blade aggregation module 814*a* may be a placebo blade aggregation module. In such an embodiment, the placebo blade aggregation module provides the necessary support and structure by serving as a platform for the transition cards 812*a-d* to connect to, without providing connectivity to the modular blades 810*a-b*.

The blade server system 800 also includes one or more unit aggregation modules 816*a-b*. As discussed above, modular blades 810*a-b*, joined by one or more blade aggregation modules 814*a-b*, constitute a bladed unit. In many embodiments, the blade server system 800 may include a number of different bladed units. For example, a 20U blade server system 800 may contain eight bladed units. In a typical embodiment, a bladed unit is a horizontal grouping such as a row. Connectivity across the row is provided by the blade aggregation modules 814*a-b*. The unit aggregation modules 816*a-b* communicatively connect the bladed sets in order to permit vertical communications between bladed modules 810*a-d* in different bladed sets.

The unit aggregation modules 816*a-b*, like the blade aggregation modules 814*a-d*, enables communications to and from the computing devices attached to the transition cards 812*a-h* over the network. The unit aggregation module 816*a-b* may have various router or hub components to enable this functionality. In another embodiment, the unit aggregation modules 816*a-b* include switches that enable the communication between two or more computing devices which are communicating with the switch. The unit aggregation modules 816*a-b* may also be identical.

As with the blade aggregation modules 814*a-d*, the number of unit aggregation modules 816*a-b* in the blade server system 800 may vary. For example, a single unit aggregation module 816*b* is sufficient to enable communication between every modular blade 810*a-d* and every network-attached device, but have insufficient bandwidth for the operations. In addition, the use of a single unit aggregation module 816*b*, while fully functional, may introduce longer latency periods between devices connected through a long path, such as the path between modular blade 810*a* and modular blade 810*c* where only unit aggregation module 816*b* is connected. Using multiple unit aggregation modules 816*a-b* provides more bandwidth, redundancy in case of failure, and may also shorten latency times in the blade server system 800. The blade server system 800, however, is customizable and scalable according to the needs of the customer.

External connectors such as external connector 813 may also be added to the transition cards 812*a-d*, as shown in the case of transition card 812*d*. These external connections may be a wide variety of types of connections known to those in the art, such as PCI express, PCI express AS, 10 GB Ethernet, SONET, Fibre channel running on twisted pair copper wire or fiber-optic cables, or other communications technologies. The external connections may go to external storage devices, internet-connected computers, or any other computing device known to those in the art which send and receive data over networks. The external connections may also be attached to a unit aggregation module 816*a-b*.

As a result, using four core connector pieces, (carrier cards, transition cards, blade aggregation modules, and unit aggregation modules), an immensely scalable and adaptable blade server system 800 can be constructed. This approach inherently offers tremendous flexibility and provides a customer a product with a longer, more versatile lifecycle. In addition, maintenance and manufacture are considerably simplified for the manufacturer.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 9:
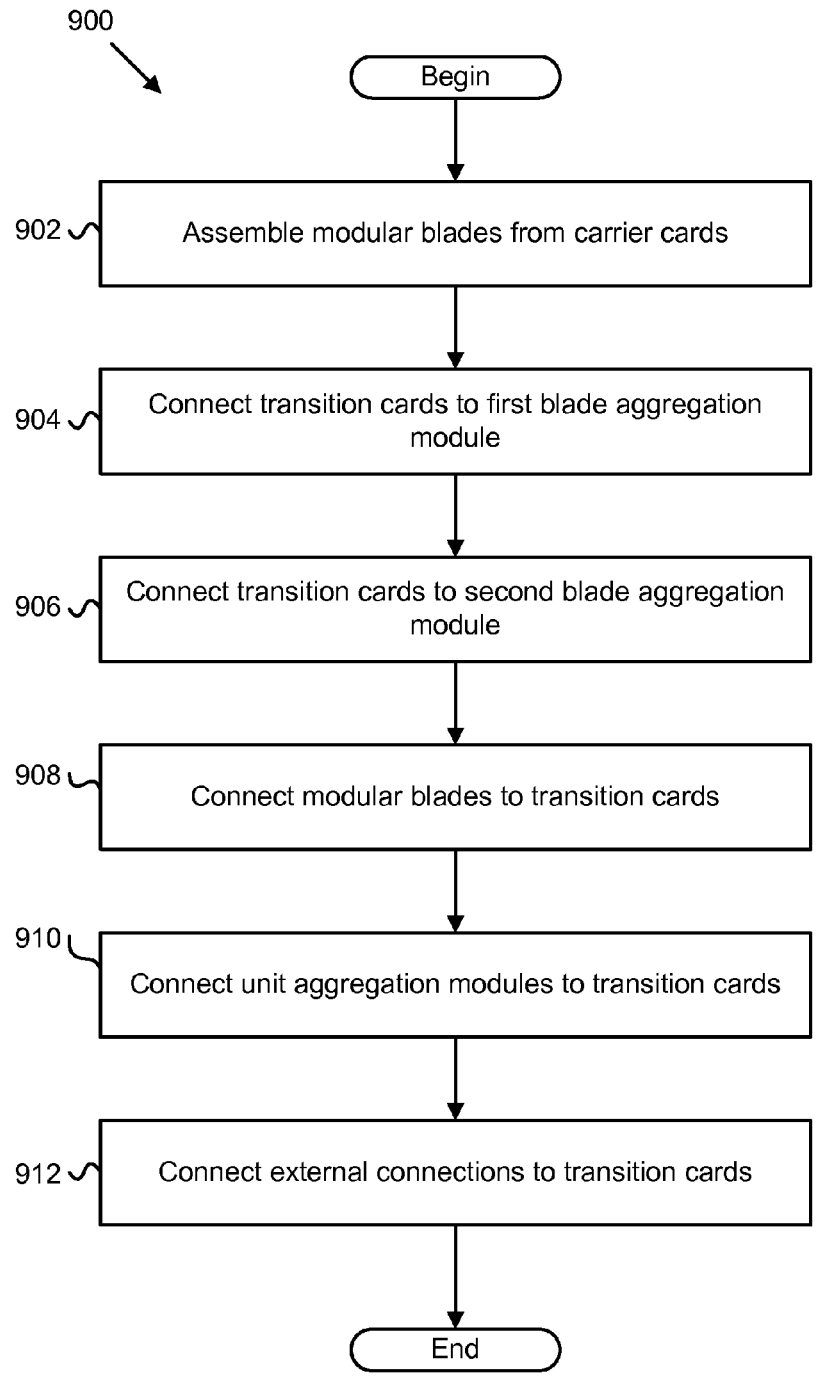
FIG. 9 is a schematic flow chart diagram illustrating one embodiment of a method for assembling a blade server system in accordance with the present invention.

FIG. 9 illustrates a method 900 for assembling a modular blade system in accordance with the present invention. The method 900 begins with a user assembling 902 modular blades 810*a-d* from two carrier cards 110, such as the carrier cards 210 and 220 shown in FIG. 2. As described above, the user may further encase the two carrier cards 110 in a shroud 620*a,b* which provides structure, protection, and shielding to the modular blade 810*a-d*. The step of assembling the modular blades 810*a-d* specifically is covered in more detail in connection with FIG. 10.

With one or more modular blades constructed, the user connects 904 the transition cards 812*a-f* to a first blade aggregation module 814*b*. In one embodiment, the transition cards 812*a-f* connect to the first blade aggregation module 814*b* through an edge connector. The first blade aggregation module 814*b*, when connected with the transition cards 812*a-f*, physically aligns the transition cards 812*a-f* to receive the modular blades 810*a-d* as shown in FIG. 8.

The user may then similarly connect 906 the assembly of the first blade aggregation module 814*b* and the transition cards 812*a-f* to a second blade aggregation module 814*a* that provides additional bandwidth and redundancy. The second blade aggregation module 814*a* may be identical to the first blade aggregation module 814*b*, or may be a placebo providing structure to the modular blade server system.

The user then connects 908 the modular blades 810*a-d* to the transition cards 812*a-f*. The plurality of modular blades 810*a-d* is thus connected to the first blade aggregation module 814*b* and the second blade aggregation module 814*a*. This grouping constitutes a bladed unit in which each computer component 120 on each modular blade 810*a-d* can communicate with every other computer component 120 in the bladed unit.

The user then connects 910 the unit aggregation modules 816*a-b* to the transition cards 812*a-f*. In one embodiment, this connection is made at the back of the transition cards 812*a-f*. The connection to one or more unit aggregation modules 816*a-b* enables the modular blades 810*a-d* in different bladed units to communicate with one another.

The user may additionally connect 912 external connections to transition cards 812*a-f*. These external connections may be a wide variety of types of connections known to those in the art, such as PCI express, PCI express AS, 10 GB Ethernet, SONET, Fibre channel running on twisted pair copper wire or fiber-optic cables, or other communications technologies. The external connections may go to external storage devices, internet-connected computers, or any other computing device known to those in the art which send and receive data over networks.

Figure 10:
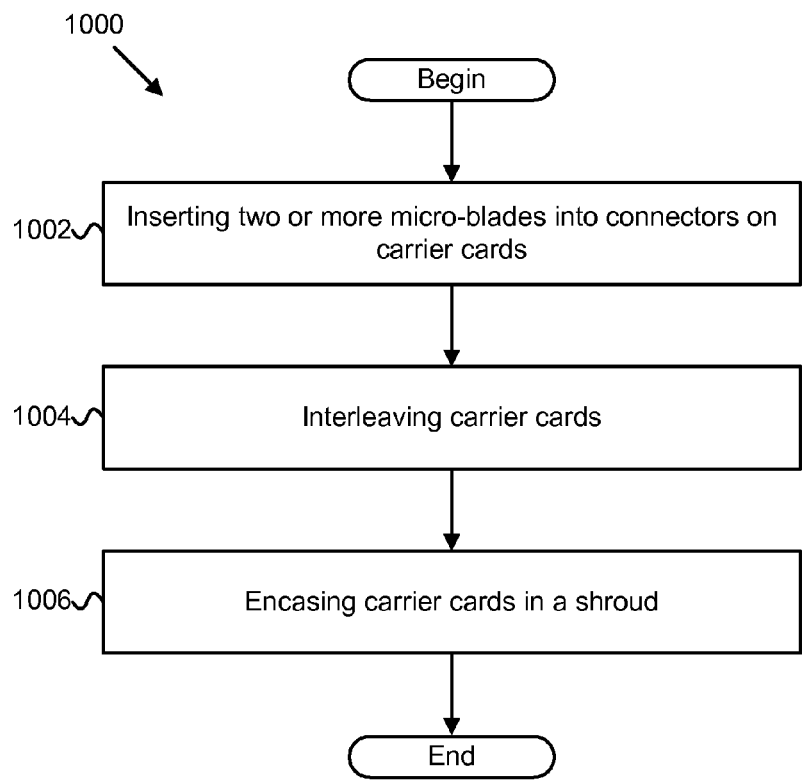
FIG. 10 is a schematic flow chart diagram illustrating one embodiment of a method for assembling a modular blade in accordance with the present invention.

FIG. 10 illustrates an embodiment of a method 1000 for assembling a modular blade 810*a-d* in accordance with the present invention. A user inserts 1002 two or more microblades into associated connectors on a first carrier card 210 and a second carrier card 220. As discussed above, the microblades may have a variety of different configurations and purposes, and can be added to the first carrier card 210 or second carrier card 220 in accordance with the needs of the user for the particular system.

The user then interleaves 1004 the computing components 212*a-f* on the first carrier card 210, such as the micro-blades, with the computing components 222*a-f* of the second carrier card 220. As discussed above, in one embodiment the user does not have to arrange the computer components such as micro-blades such that they interleave; rather, the computer components, such as the slots that receive the micro-blades, are situated on the first carrier card 210 such that attached micro-blades automatically interleave with the micro-blades of the second carrier card 220. Thus, the user simply attaches the desired micro-blades to the two carrier cards, rotates one with respect to the other, and pushes the two together. The result is a modular blade with interleaving computer components.

The user then encases 1006 the two carrier cards in a shroud, such as a shroud 620*a,b*, made up of a first part 620*a* and a second part 620*b*. This shrouding provides a form factor which holds the first carrier card 210 and the second carrier card 220 in the interleaved position and also provides physical protection, along with electromagnetic and electrostatic shielding.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A modular blade comprising:
    a first carrier card having a backplane connector that connects to a backplane of a computer system, the first carrier card further configured to receive a plurality of computer components, the first carrier card communicatively connecting one or more of the computer components and the backplane connector, the first carrier card further communicatively connecting two or more of the computer components;
    a second carrier card configured to receive a plurality of computer components, the second carrier card communicatively connecting one or more of the computer components of the second carrier card;
    the first carrier card facing the second carrier card such that two or more computer components of the first carrier card interleave with two or more computer components of the second carrier card, wherein interleaving comprises alternating computer components of the first carrier card with computer components of the second carrier card along one or more axes of the modular blade; and
    wherein the second carrier card is interchangeable with the first carrier card, and wherein the first carrier card is asymmetrical about an axis of the first carrier card and the second carrier card is asymmetrical about an axis of the second carrier card.

2. The modular blade of claim 1, wherein the second carrier card is identical to the first carrier card, and wherein the second carrier card is rotated about one of a longitudinal axis and a midpoint axis one-hundred and eighty degrees with respect to the first carrier card.

3. The modular blade of claim 1, wherein interleaving further comprises alternating computer components of the first carrier card with computer components of the second carrier card along one or more axes of the modular blade such that the computer components stack along one or more axes without physically touching computer components on an opposite carrier card.

4. The modular blade of claim 1, wherein the axis of the first carrier card and the axis of the second carrier card is one of a longitudinal axis, a midpoint axis, a diagonal axis, and a combination of said axes.

5. The modular blade of claim 1, wherein the computer system is one of a computer rack, a computer chassis, and a blade enclosure.

6. The modular blade of claim 1, the first and second carrier cards further providing one or more of mechanical connectivity and power connectivity between the one or more computer components, and wherein communications connectivity is one of optical connectivity and electrical connectivity.

7. The modular blade of claim 1, further comprising a connectivity module enabling communications between computer components of the first carrier card and computer components of the second carrier card.

8. The modular blade of claim 7, the connectivity module communicatively connecting one or more computing components of the second carrier card with the first carrier card, the computing components of the second carrier card responding to commands from a baseboard management controller (BMC) located on the first carrier card.

9. The modular blade of claim 1, further comprising one or more baseboard management controllers (BMCs).

10. The modular blade of claim 1, wherein one or more computer components are micro-blades comprising memory, an input module, and an output module, each micro-blade connecting to one of the first carrier card and second carrier card through a non-cable connection.

11. The modular blade of claim 10, wherein the non-cable connection is one of a PCI express connection, an Infiniband connection, an Ethernet connection, an intelligent platform management interface (IPMI) connection, an $I^2C$ connection, and a Fibre Channel connection.

12. The modular blade of claim 10, the one or more micro-blades further comprising one of a general processor, a specialized processor, and a programmable logic array processor.

13. The modular blade of claim 9, wherein the BMC is a micro-blade comprising a processor, memory, an input module, and an output module.

14. The modular blade of claim 1, further comprising an interior airflow channel along the length of the modular blade.

15. The modular blade of claim 1, further comprising a shroud encasing the first carrier card and second carrier card, the shroud providing electromagnetic and electrostatic shielding.

16. The modular blade of claim 1, the first carrier card further comprising one or more additional backplane connectors, and the second carrier card further comprising one or more backplane connectors.

17. A modular blade system, the system comprising:
one or more modular blades, each modular blade comprising:
a first carrier card having a backplane connector that connects to a backplane of a computer system, the first carrier card further configured to receive a plurality of computer components, the first carrier card communicatively connecting one or more of the computer components and the backplane connector, the first carrier card further communicatively connecting two or more of the computer components;
a second carrier card configured to receive a plurality of computer components, the second carrier card communicatively connecting one or more of the computer components of the second carrier card;
a shrouding encasing the first carrier card and the second carrier card;
the first carrier card facing the second carrier card such that two or more computer components of the first carrier card interleave with two or more computer components of the second carrier card, wherein interleaving comprises alternating computer components of the first carrier card with computer components of the second carrier card along one or more axes of the modular blade;
wherein the second carrier card is interchangeable with the first carrier card, and wherein the first carrier card is asymmetrical about an axis of the first carrier card and the second carrier card is asymmetrical about an axis of the second carrier card; and
a backplane of a blade server, the backplane comprising:
a blade connectivity module configured to enable communications between one or more computing devices attached to the backplane, the one or more computing devices comprising one or more modular blades and one or more computing devices connected over a network;
a power distribution module, the power distribution module configured to supply power to one or more modular blades attached to the backplane.

18. The system of claim 17, the blade connectivity module further comprising:
one or more blade aggregation modules enabling communications between one or more modular blades;
one or more transition cards, each transition card connecting with the blade aggregation module, one or more transition cards connecting with the backplane connectors of the modular blades, and one or more transition cards connecting with the one or more computing devices connected over a network.

19. The system of claim 18, wherein a first blade aggregation module is connected to a first connector of each transition card, and a second blade aggregation module is connected to a second connector of each transition card connected to the first blade aggregation module.

20. The system of claim 19, wherein the second blade aggregation module is identical to the first blade aggregation module.

21. The system of claim 18, wherein each blade aggregation module comprises one or more switches that provide communication between two or more computing devices communicating with the switch.

22. The system of claim 18, wherein one or more blade aggregation modules connected with a set of modular blades by one or more transition cards constitutes a bladed unit, the blade connectivity module further comprising one or more unit aggregation modules communicatively connecting two or more bladed sets.

23. The system of claim 22, wherein each of the one or more unit aggregation modules comprises one or more switches.

24. A method for arranging a modular blade system, the method comprising:
assembling one or more modular blades comprising a first carrier card, the first carrier card configured to receive a plurality of computer components, and a second carrier card configured to receive a plurality computer components, wherein the second carrier card is interchangeable with the first carrier card, and wherein the first carrier card is asymmetrical about an axis of the first carrier card and the second carrier card is asymmetrical about an axis of the second carrier card;
connecting one or more transition cards to a first blade aggregation module, the first blade aggregation module aligning the plurality of transition cards to receive one or more modular blades;
connecting the one or more transition cards to a second blade aggregation module, the second blade aggregation module identical to the first blade aggregation module; and
connecting each of the one or more modular blades to at least one of the plurality of transition cards.

25. The method of claim 24, wherein assembling a modular blade further comprises inserting two or more micro-blades into one or more connectors of the first carrier card and one or more connectors of the second carrier card, the micro-blades of the second carrier card interleaving with the micro-blades of the first carrier card, interleaving comprising alternating computer components of the first carrier card with computer components of the second carrier card along one or more axes of the modular blade, and encasing the first carrier card and the second carrier card in a shroud.

* * * * *